United States Patent
Saito

(10) Patent No.: US 9,543,474 B2
(45) Date of Patent: Jan. 10, 2017

(54) MANUFACTURE METHOD OF MAKING SEMICONDUCTOR OPTICAL DEVICE

(71) Applicant: STANLEY ELECTRIC CO., LTD., Meguro-ku, Tokyo (JP)

(72) Inventor: Tatsuma Saito, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/747,862

(22) Filed: Jun. 23, 2015

(65) Prior Publication Data

US 2015/0295131 A1 Oct. 15, 2015

Related U.S. Application Data

(63) Continuation of application No. PCT/JP2013/007551, filed on Dec. 24, 2013.

(30) Foreign Application Priority Data

Jan. 29, 2013 (JP) ................................. 2013-013859

(51) Int. Cl.
*H01L 33/20* (2010.01)
*H01L 33/32* (2010.01)
(Continued)

(52) U.S. Cl.
CPC ........... *H01L 33/20* (2013.01); *H01L 33/0075* (2013.01); *H01L 33/22* (2013.01); *H01L 33/32* (2013.01);
(Continued)

(58) Field of Classification Search
CPC ...... H01L 33/007; H01L 33/075; H01L 33/20; H01L 33/22; H01L 33/32
See application file for complete search history.

(56) References Cited

U.S. PATENT DOCUMENTS 5,214,306 A 5/1993 Hashimoto
5,545,291 A 8/1996 Smith et al.
(Continued)

FOREIGN PATENT DOCUMENTS

EP 1331673 A2 7/2003
EP 2367210 A2 9/2011
(Continued)

OTHER PUBLICATIONS

International Search Report (ISR) and Written Opinion (WO) dated Jan. 28, 2014 issued in International Application No. PCT/JP2013/007551.

(Continued)

*Primary Examiner* — Thanh V Pham
(74) *Attorney, Agent, or Firm* — Holtz, Holtz & Volek PC

(57) ABSTRACT

The semiconductor optical device has a chip of semiconductor lamination having a first semiconductor layer of a first conductivity type having a first surface, a second semiconductor layer of a second conductivity type opposite to the first conductivity type having a second surface, and an active layer sandwiched between the first semiconductor layer and the second semiconductor layer, the chip having side surface including a first side surface which is contiguous to the second surface, forms an obtuse angle with the second surface, extends across the second semiconductor layer and the active layer, and enters the first semiconductor layer, and a cracked surface which is contiguous to the first side surface, a first conductivity type side electrode formed on the first surface, and a second conductivity type side electrode formed on the second surface, wherein in-plane size of the semiconductor lamination is 50 μm or less.

11 Claims, 5 Drawing Sheets

(51) Int. Cl.
*H01L 33/22* (2010.01)
*H01L 33/00* (2010.01)

(52) U.S. Cl.
CPC ........ *H01L 33/0079* (2013.01); *H01L 33/0095* (2013.01)

(56) References Cited

U.S. PATENT DOCUMENTS

| | | | |
|---|---|---|---|
| 5,563,422 | A | 10/1996 | Nakamura et al. |
| 5,824,186 | A | 10/1998 | Smith et al. |
| 2002/0024052 | A1 | 2/2002 | Liang et al. |
| 2005/0186760 | A1* | 8/2005 | Hashimura ............ B23K 26/18 438/460 |
| 2006/0091409 | A1 | 5/2006 | Epler et al. |
| 2006/0240585 | A1 | 10/2006 | Epler et al. |
| 2007/0001186 | A1 | 1/2007 | Murai et al. |
| 2007/0114550 | A1 | 5/2007 | Kato et al. |
| 2009/0267096 | A1 | 10/2009 | Kim |
| 2010/0041170 | A1 | 2/2010 | Epler et al. |
| 2010/0187555 | A1 | 7/2010 | Murai et al. |
| 2011/0079798 | A1 | 4/2011 | Ogihara |
| 2011/0084301 | A1 | 4/2011 | Epler et al. |
| 2011/0104835 | A1* | 5/2011 | Nihei .................. H01L 33/0079 438/28 |
| 2011/0272726 | A1 | 11/2011 | Kim |
| 2012/0080695 | A1* | 4/2012 | Lee ....................... H01L 27/156 257/91 |
| 2012/0187440 | A1 | 7/2012 | Kim |
| 2013/0020596 | A1 | 1/2013 | Kim |
| 2013/0313562 | A1 | 11/2013 | Epler et al. |
| 2014/0077251 | A1 | 3/2014 | Kim |

FOREIGN PATENT DOCUMENTS

| | | |
|---|---|---|
| JP | 61018177 A | 1/1986 |
| JP | 07094782 A | 4/1995 |
| JP | 09120943 A | 5/1997 |
| JP | 10242518 A | 9/1998 |
| JP | 2006128710 A | 5/2006 |
| JP | 2006339551 A | 12/2006 |
| JP | 2008547210 A | 12/2008 |
| JP | 2009267418 A | 11/2009 |
| JP | 2011077447 A | 4/2011 |
| JP | 2011119383 A | 6/2011 |

OTHER PUBLICATIONS

Japanese Office Action dated Aug. 9, 2016 issued in counterpart Japanese Application No. 2013-013859.
Extended European Search Report dated Aug. 17, 2016, issued in counterpart European Application No. 13873578.2.

* cited by examiner

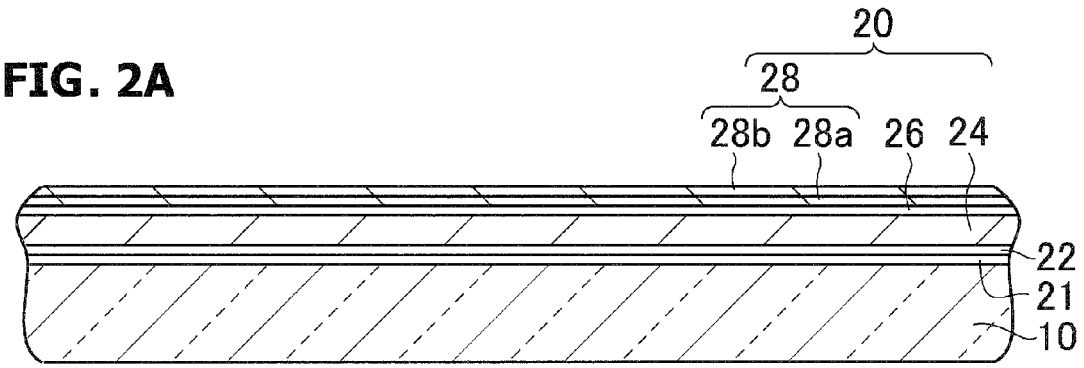
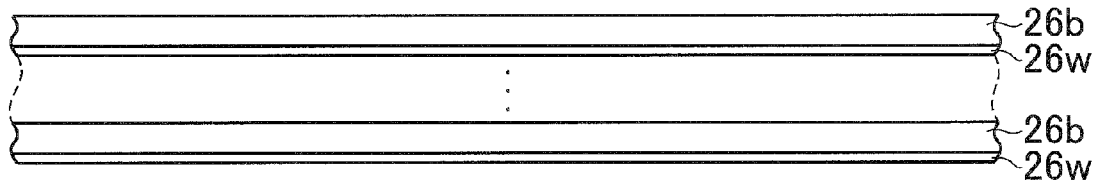
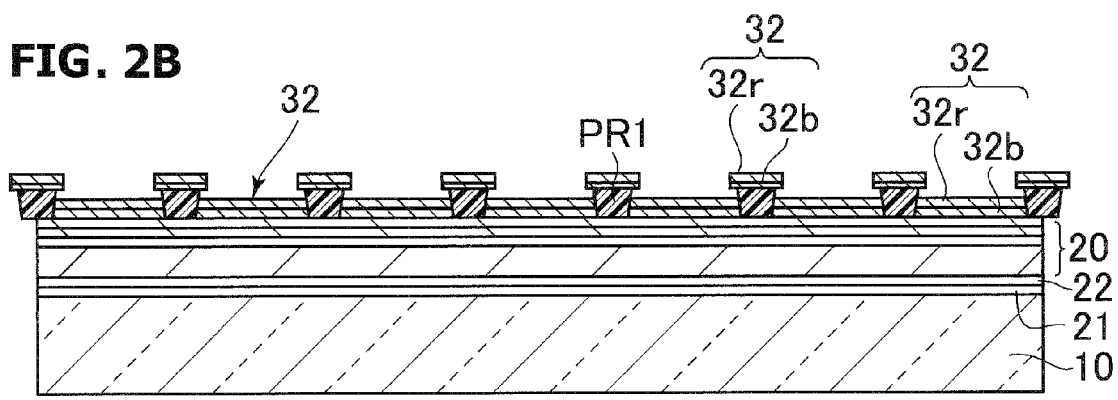
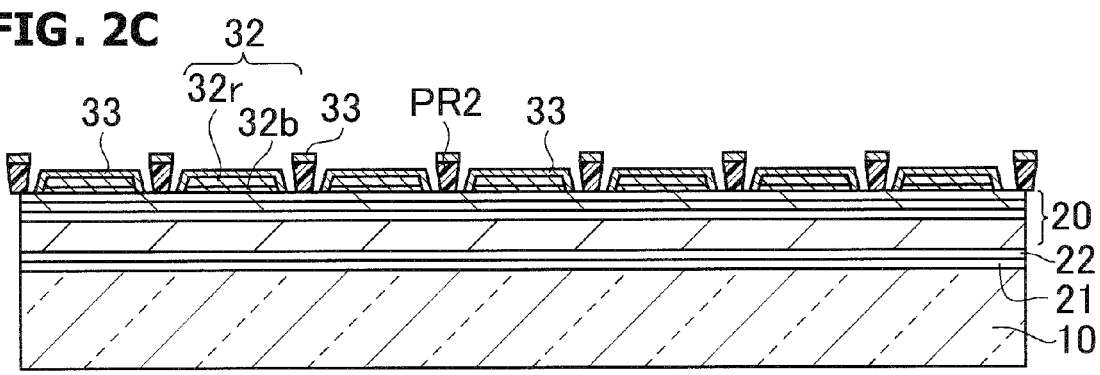

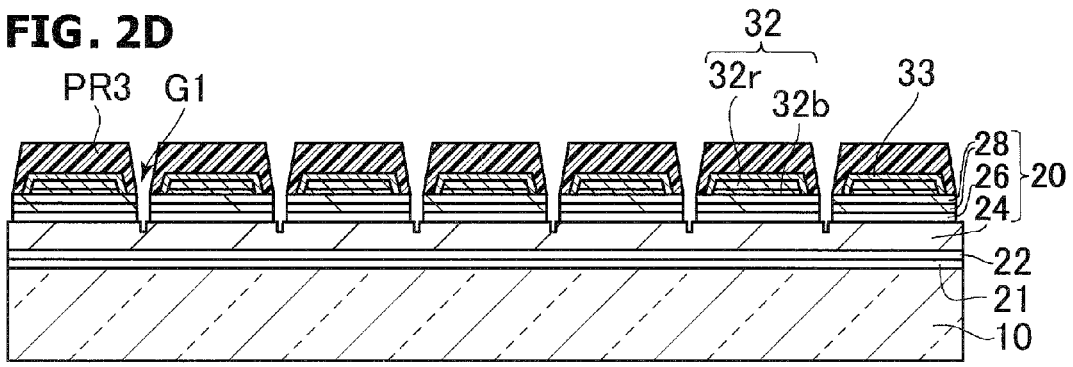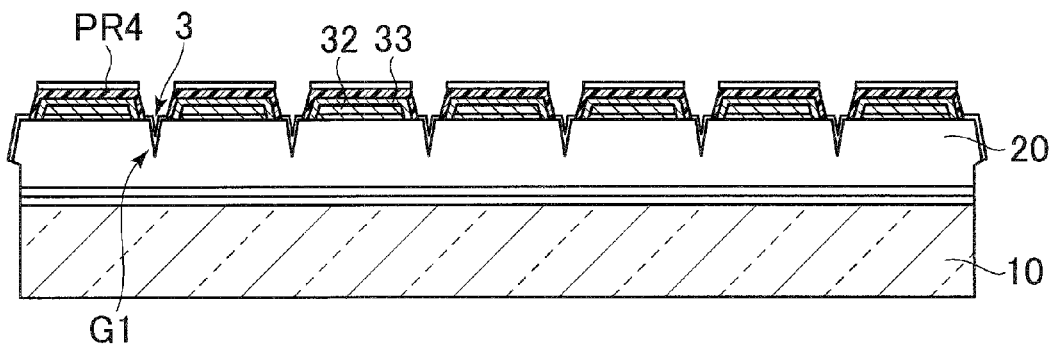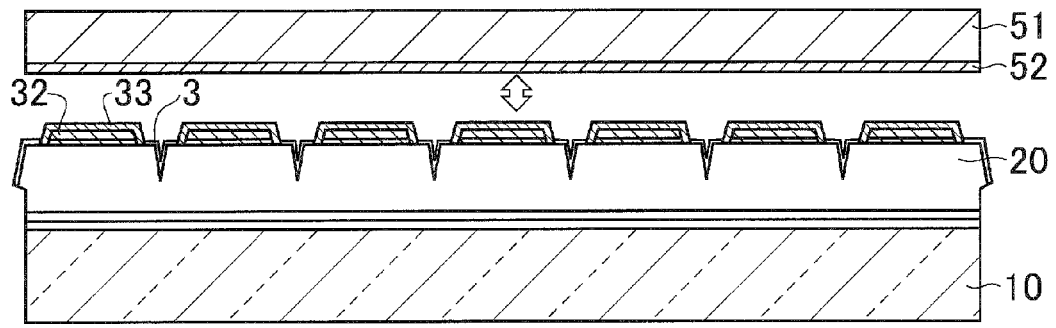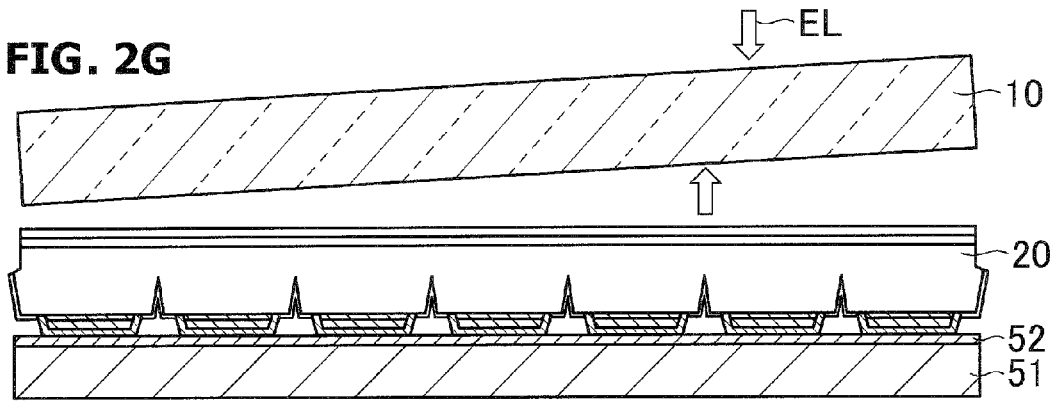

MANUFACTURE METHOD OF MAKING SEMICONDUCTOR OPTICAL DEVICE

FIELD OF THE ART

This invention relates to a semiconductor optical device, and a method for manufacturing the semiconductor optical device.

BACKGROUND ART

Semiconductor light emitting elements, such as light emitting diodes, and semiconductor light receiving elements, such as photodiodes, are known as the semiconductor optical devices. Light emitting diode and photodiode are formed of semiconductor chips, each including an n-type region, a p-type region, and in many cases an active region disposed between the n-type and the p-type regions. In most cases, individual semiconductor chips (dies) are mounted in respective packages. Even in case of forming an optically active plane or surface, individual semiconductor chips serving as point elements are often located and distributed to form a plane. Description will be made hereinafter on semiconductor light emitting elements such as light emitting diodes, by way of example.

Light emitting diodes distributed in predetermined plane constitute assembly of point light sources. For example, traffic signal light in which a multiplicity of light emitting diodes are distributed in circular light emitting plane is used. An observer located near the traffic signal light can recognize that a multiplicity of light emitting diodes are disposed in a circular light emitting plane. It will be more preferable if the circular light emitting plane can uniformly emit light. In such use as illuminating a wide area uniformly, a plane-shaped light source is desirable. For example, in case of using a light emitting diode as backlight of a liquid crystal display, lights emitted from the light emitting diode may be introduced in diffusion plate having light scattering function, to constitute pseud-plane light source.

Light emitting diodes (LEDs) using nitride semiconductors such as GaN (gallium nitride) can emit ultraviolet light or blue light. By using fluorescence material, lights of three primary colors or white lights can be emitted. The light emitting diode has semiconductor lamination including, at least, an n-type semiconductor layer, an active layer for emitting light, and a p-type semiconductor layer. When nitride series semiconductor is used as the semiconductor lamination, for example a sapphire substrate is used as a growth substrate for growing the nitride series semiconductors. From the viewpoint of convenience of epitaxial growth, usually an n-type layer is first grown on a growth substrate, and an active layer and a p-type layer are grown thereon.

Sapphire substrate has low thermal conductivity, and hence is poor in heat dissipating ability. Sapphire substrate is therefore not fitted for such devices which are driven at large power, such as high power LED. In recent years, technology of laser lift-off is developed, in which on a sapphire substrate, nitride semiconductor lamination is grown, a p-side electrode is formed on the p-type layer, and a support substrate of silicon etc. having a high heat dissipating ability is bonded thereon, thereafter laser light is irradiated from the sapphire substrate side, to partially decompose the epitaxial layer, and to lift-off the sapphire growth substrate (for example, JPA 2006-128710). When a non-transparent support substrate such as silicon is used, output light cannot be derived through the support substrate. On the n-type semiconductor layer exposed by lifting-off the sapphire growth substrate, an n-side electrode can be formed. In this case, since current can be flown across the thickness direction of the semiconductor lamination, it is effective in reducing the resistance in the current path.

As p-type electrode, for example, a p-side transparent electrode and a reflecting electrode are formed over almost the whole area of the light emitting area of the p-type semiconductor layer. The efficiency of deriving lights can be improved by reflecting lights directed toward the support substrate. The n-side electrode is formed on at least part of the surface of the n-type semiconductor layer, which serves as light emitting surface. Lights emitted from the active layer, are partly emitted directly from the n-type semiconductor layer, and are partly transmitted through the p-side transparent electrode formed on the p-type semiconductor layer, then reflected by the reflecting electrode, and emitted through the n-type semiconductor layer.

The light emitting diode usually includes a growth substrate or a support substrate in part of the structure. When a light emitting diode having an area larger than a certain degree is to be constructed only with epitaxial layers, the strength usually becomes insufficient. When a growth substrate is to be removed, a support substrate is usually bonded.

There are proposals (for example, JPA 2011-77447) of designing bear chips of light emitting diodes smaller than the conventional typical minimum size (300 μm×300 μm), and handling only the epitaxial laminations. A plurality of single crystal semiconductor thin films are arranged in a predetermined plane, and the plane is constructed as assembly of light sources. For example, light emitting members having a size of 100 μm are disposed at a pitch of 200 μm, or light emitting members having a size of 10 μm are disposed at a pitch of 20 μm. The plane of the light emitting area is arranged to have a desired shape.

Respective light emitting members may be formed as follows. Semiconductor lamination is formed on a growth substrate through a sacrificial layer, and island-shaped trapezoidal patterns are shaped by mesa-etching. The sacrificial layer is selectively etched off to lift off the patterned semiconductor laminations from the growth substrate.

SUMMARY OF THE INVENTION

An object of this invention is to provide a semiconductor optical device having a novel structure and being capable of increasing freedom in design of an optically active plane.

According to first aspect of the embodiment, there is provided a semiconductor optical device comprising:

a chip of semiconductor lamination including a first semiconductor layer of a first conductivity type having a first surface, a second semiconductor layer of a second conductivity type opposite to the first conductivity type having a second surface, and an active layer sandwiched between the first semiconductor layer and the second semiconductor layer, the chip having side surface including a first side surface which is contiguous to said second surface, forms an obtuse angle with the second surface, extends across said second semiconductor layer and said active layer, and enters said first semiconductor layer, and a cracked surface which is contiguous to said first side surface;

a first conductivity type side electrode formed on said first surface; and a second conductivity type side electrode formed on said second surface;

wherein in-plane size of said semiconductor lamination is 50 μm or less.

According to second aspect of the embodiment, there is provided a method for manufacturing semiconductor optical device comprising:

epitaxially growing, on a growth substrate, semiconductor lamination including a first semiconductor layer of a first conductivity type having a first surface, a second semiconductor layer of a second conductivity type opposite to the first conductivity type having a second surface, and an active layer sandwiched between the first semiconductor layer and the second semiconductor layer;

forming a second conductivity type side electrode on said second surface;

forming first isolation grooves from said second surface, penetrating through said second semiconductor layer and said active layer, and entering said first semiconductor layer;

bonding support body on said second conductivity type side electrode;

removing said growth substrate;

forming a first conductivity type side electrode on said first surface exposed;

separating said semiconductor lamination from said support body; and dipping said semiconductor lamination in solvent, applying ultrasonic waves, thereby separating said semiconductor lamination at locations of said first isolation grooves.

There can be provided a semiconductor optical device of a novel structure.

Freedom in design of optically active plane can be improved by using minute semiconductor optical devices.

DESCRIPTION OF THE PREFERRED EMBODIMENTS

Figure 1A:
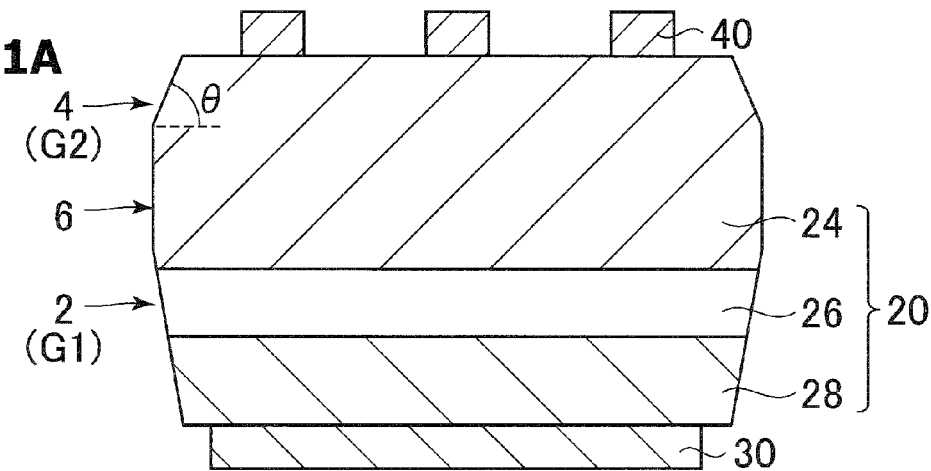
FIGS. 1A and 1AB are a schematic cross sectional view and a schematic plan view illustrating structure of a light emitting diode according to a first embodiment.
Figure 1A:
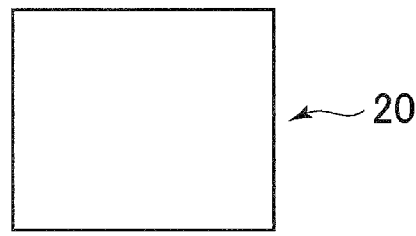

FIGS. 1A and 1AB are a cross sectional view and a plan view illustrating a light emitting element according to a first embodiment. As illustrated in FIG. 1A, an n-type GaN layer 24 having an outwardly oriented first surface, a p-type GaN layer 28 having an outwardly oriented second surface, and a GaN active layer 26 sandwiched between the n-type GaN layer 24 and the p-type GaN layer 28 constitute a semiconductor lamination 20. A p-side electrode 30 is formed on the second surface of the p-type GaN layer 28, and an n-side electrode 40 is formed on the first surface of the n-type GaN layer 24.

As illustrated in FIG. 1AB, the semiconductor lamination 20 has a plan shape of rectangle. The size of one side is 50 µm or less. There is no particular lower limit for the size of one side. Considering the cutting margin and the effective use of the epitaxial layer, size of 10 µm or more would be preferable. In the case of square planar shape, this leads to size range of 10 µm square to 50 µm square. It is also possible to select an optional parallelogram shape, such as rectangle. The size from the lower surface of the p-side electrode 30 in the figure to the upper surface of the n-side electrode 40 in the figure is 4 µm to 10 µm. Namely, typical size of the light emitting diode includes a thickness of 4 µm to 10 µm, and a planar size of 10 µm square to 50 µm square. The GaN semiconductor lamination having in-plane size of 50 µm square or less becomes hard to be broken or cracked, since stress and strain can be easily released because of smallness. Thus, the thickness of the order of 4 µm can provide sufficient self-supporting ability.

As illustrated in FIG. 1A, the side surface of the semiconductor lamination 20 includes side surface 2 of first isolation groove G1 starting from the second surface of the p-type GaN layer 28, penetrating through the p-type GaN layer 28 and the GaN active layer 26, and reaching inside of the n-type GaN layer 24, and side surface 4 of second isolation groove G2 starting from the first surface of the n-type GaN layer 24, at the location opposing the first isolation groove G1, formed to an intermediate depth of the n-type GaN layer 24 to leave a gap of 2 µm to 4 µm from the first isolation groove. These side surfaces are etched surfaces (rough surfaces). When the first isolation groove G1 and the second isolation groove G2 are formed by etching, the width of the groove becomes narrower as the position is shifted from the outer surface toward inside in the thickness direction. From the point of the in-plane size of the semiconductor lamination, the in-plane size becomes larger as the position is shifted from the outer surface toward inside in the thickness direction. When isolation grooves G2 and G1 defining the chip shape are formed from the upper and lower surfaces of the semiconductor lamination, and the remaining thickness is small, it is easy to crack the remaining thickness by external force. Intermediate side surface 6 is a surface cracked by external force. Ultrasonic waves or pinch-roller may be used as external force.

Figure 1B:
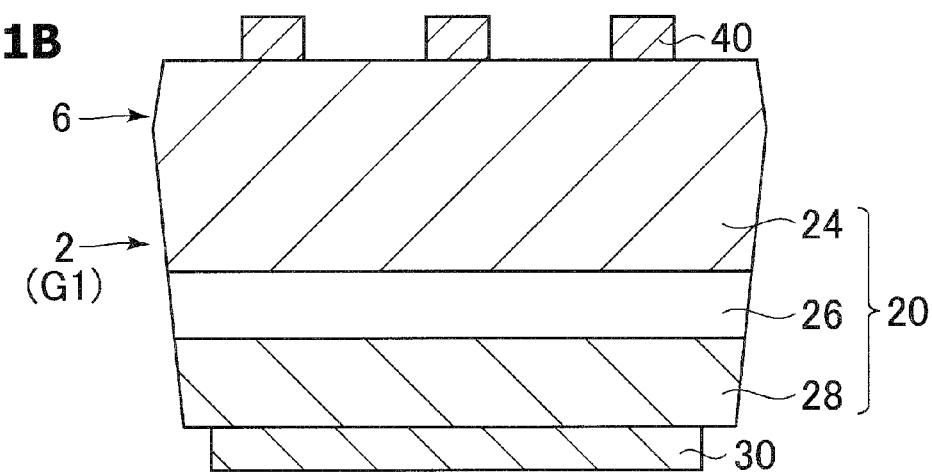
FIG. 1B is a schematic cross sectional view of a light emitting diode according to a second embodiment.

FIG. 1B is a cross section of a semiconductor light emitting diode according to a second embodiment. Description will be made mainly on different points from the first embodiment. In the first embodiment, in the semiconductor lamination 20, the first groove G1 is formed from the second surface of the p-type GaN layer 28, and the second groove G2 is formed from the first surface of the n-type GaN layer 24, while leaving a depth region not formed with an isolation groove in the intermediate part. In the second embodiment, the second isolation groove G2 is not formed. The first isolation groove G1 is formed from the second surface of the p-type GaN layer 28 of the semiconductor lamination 20, penetrating through the p-type GaN layer 28 and the GaN active layer 26, and entering the n-type GaN layer 24, to leave a gap of 2 µm to 4 µm between the first surface and the first isolation groove. The remaining thickness is cracked by external force to isolate chips. Thus, the side surface of the semiconductor lamination 20 is constructed of the side surface 2 of the isolation groove and cracked side surface 6.

In either the embodiment of FIG. 1A or the embodiment of FIG. 1B, when plural elements are dispersed in solvent, there are possibilities of collision between the elements. Side surfaces without projections, and having such a shape resembling a curved surface would form stronger shape against collisions. Due to the existence of side surfaces 2, 4, and 6 in FIG. 1A, and side surfaces 2 and 6 in FIG. 1B, the angle at the corner (bulk angle) can be made large (for example forming obtuse angle), forming advantageous structure against collisions. Existence of cracked side surface 6 makes the structure stronger against collisions.

In the first and the second embodiments, chips are formed solely of epitaxial lamination, featuring side surfaces constructed of etching surfaces and crystal cracked surfaces.

Figure 1C:
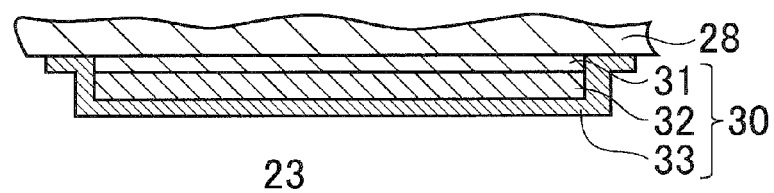
FIGS. 1C and 1D are schematic cross sectional views illustrating modifications.

FIG. 1C illustrates a structural example of the p-side electrode 30. On the surface of the p-type GaN layer 28, a transparent electrode 31 for example of ITO (indium tin oxide), and a reflecting electrode 32 such as Ag (silver) are laminated, and then a metal cap layer 33 formed of lamination of TiW (titan tungsten)/Ti/Pt (platinum)/Au (gold) etc. is formed to cover the exposed front and side surfaces of the reflecting electrode. The reflecting electrode 32 may be formed of Ag, Al (aluminum), Rh (rhodium), Pd (palladium), alloys thereof, etc.

Figure 1D:
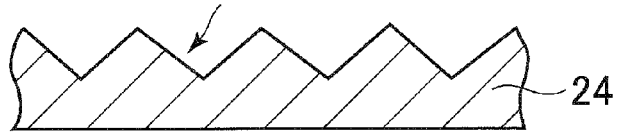

FIG. 1D illustrates a structural example of the surface of the n-type GaN layer 24. Micro-cones 23 for increasing the efficiency of deriving light output are formed in the surface of the n-type GaN layer 24. The structure of the lamination may adapt various known structures.

Manufacturing processes of the light emitting diode according to the first embodiment will be described referring to FIGS. 2A-2N. First, process for forming semiconductor lamination on a growth substrate by MOCVD (metal organic chemical vapor deposition or metal organic vapor phase epitaxy) is performed.

As illustrated in FIG. 2A, on a C-plane sapphire substrate 10, semiconductor device lamination including an n-type semiconductor layer 24, an active layer 26, and a p-type semiconductor layer 28 is grown via a buffer layer 21, and an underlying layer 22. The respective layers are formed of nitride semiconductors represented as $Al_xIn_yGa_{1-x-y}N$ (aluminum-indium-gallium-nitride, $0 \leq x \leq 1$, $0 \leq y \leq 1$), and may be doped with n-type dopant such as Si (silicon), or p-type dopant such as Mg (magnesium) according to necessity.

For example, the sapphire substrate 10 is heated in the MOCVD apparatus in hydrogen atmosphere at 1000° C., for 10 minutes, to perform thermal cleaning. Then, TMG (trimethylgallium): 10.4 µmol/min and $NH_3$: 3.3 SLM are supplied at about 500° C. for 3 minutes, to form a GaN low temperature buffer layer 21 on the sapphire substrate 10. The temperature is raised up till 1000° C., and maintained for 30 seconds, to crystallize the GaN low temperature buffer layer 21. Keeping the same temperature, TMG (trimethylgallium): 45 µmol/min, and $NH_3$: 4.4 SLM are supplied for 20 minutes to grow an underlying GaN layer 22 to about 1 µm. Then at the temperature of 1000° C., TMG (trimethylgallium): 45 µmol/min, $NH_3$: 4.4 SLM, and $SiH_4$: $2.7 \times 10^{-9}$ µmol/min are supplied for 120 minutes, to grow an n-type GaN layer 24 to a thickness of about 7 µm. An active layer 26 is formed, for example of a multiple quantum well structure, on the n-type GaN layer 24.

As illustrated in FIG. 2AB, TMG: 3.6 µmol/min, TMI (trimethylindium): 10 µmol/min, and $NH_3$: 4.4 SLM are supplied at 700° C., on the substrate for 33 seconds, to grow an InGaN well layer 26w of a film thickness of about 2.2 nm. Stopping supply of TMI, TMG: 3.6 µmol/min, and $NH_3$: 4.4 SLM are supplied on the substrate for 320 seconds to grow a GaN barrier layer 26b of a film thickness of about 15 nm. Pairs of a well layer 26w and a barrier layer 26b are repeatedly grown for 5 periods.

Returning to FIG. 2A, the temperature is raised to 870° C., and TMG: 8.1 µmol/min, TMA (trimethylaluminum): 7.5 µmol/min, $NH_3$: 4.4 SLM, and CP2Mg (bis(cyclopentadienyl)magnesium): $2.9 \times 10^{-7}$ µmol/min are supplied on the substrate for 5 minutes, to grow a p-type AlGaN clad layer 28a to a film thickness of about 40 nm. At the same temperature, stopping supply of TMA, TMG: 18 µmol/min, $NH_3$: 4.4 SLM, and CP2Mg: $2.9 \times 10^{-7}$ µmol/min are supplied on the substrate for 7 minutes, to grow a p-type GaN layer 28b to a film thickness of about 150 nm. The p-type AlGaN clad layer 28a and the p-type GaN layer 28b may be collectively called as a p-type layer 28.

As illustrated in FIG. 2B, a photoresist pattern PR1 for patterning the p-type electrode is formed on the p-type GaN layer 28b. A Pt layer 32b of a film thickness of 1 nm and a p-side reflecting electrode 32 including an Ag layer 32r of a film thickness of 150 nm are deposited by electron beam deposition on the p-type GaN layer 28b, via the photoresist pattern PR1. Thereafter, the photoresist pattern PR1 is removed, lifting off the electrode layer thereon.

As illustrated in FIG. 2C, a photoresist pattern PR2 defining gap around the p-side reflecting electrode 32 is formed on the p-type GaN layer 28b, and then metal cap layer 33 including Ti: 100 nm/Pt: 100 nm/Au: 200 nm is formed by electron beam deposition or sputtering. Then, the photoresist pattern PR2 is removed, lifting-off the metal cap layer 33 thereon. The bottom surface of the Ag layer 32r is covered with the Pt layer, and the side and the top surfaces of the Ag layer 32r are covered with the metal cap layer 33, suppressing diffusion of Ag.

As illustrated in FIG. 2D, a photoresist pattern PR3 defining apertures of isolating groove regions between adjacent metal cap layers 33 is formed covering the metal cap layer 33 which covers the p-side reflecting electrode 32. The semiconductor lamination 20 exposed outside of the photoresist pattern PR3 is etched by reactive ion etching (RIE) using $Cl_2$ gas, from the p-type GaN layer 28b, penetrating through the active layer 26 and entering the n-type GaN layer 24, to form first isolation grooves G1. For example, etching is done with process pressure: 0.5 Pa, antenna power: 550 W, bias power: 500 W, and $Cl_2$ supply rate: 20 sccm, for 2 minutes. Here, the etching speed of the GaN layer is of the order of 440 nm/min, and the etching depth is set to be of the order of about 1 µm. The active layer 26 and the n-type GaN layer 24 are exposed on side surfaces of the first isolation grooves G1. The width of the first isolation groove G1 becomes narrower with increase in the depth. The slanted side surfaces of the groove have shape of outwardly expanding as it goes upward, and the slanted surface of the groove forms an obtuse bulk angle with the front surface of the semiconductor lamination (c.f. FIG. 1A). The photoresist pattern PR3 is removed thereafter.

As illustrated in FIG. 2E, a photoresist pattern PR4 covering the metal cap layer 33 which covers the p-side reflecting electrode 32, and exposing the first isolation grooves G1 is formed, and an insulating protective film 3 such as silicon oxide is deposited to cover the surfaces of the first isolation grooves, by sputtering etc. to a thickness of the order of 100 nm to 600 nm. Thereafter, the photoresist pattern PR4 is removed together with the insulating protective film deposited thereon.

As illustrated in FIG. 2F, disposing a support substrate 51 of silicon etc. formed with a fusing or melting layer 52 such as In, above the metal cap layer 33 on the p-side reflecting electrode 32, the fusing layer 52 is fused to couple or bond with the metal cap layer 33. Anything may be used as the fusing layer 52, provided that it can exhibit physical supporting force, and can be removed afterward by etching etc.

As illustrated in FIG. 2G, the sapphire substrate 10 is lifted off by irradiating, for example KrF excimer laser light EL from the sapphire substrate 10 side. The laser light EL is transmitted through the sapphire substrate 10, and is absorbed in the GaN layer. The low temperature buffer layer 21 (and the underlying GaN layer 22) which is a GaN layer contiguous to the sapphire substrate 10 is decomposed by absorbing the laser light, to lift off the sapphire substrate 10. Residual Ga etc. remaining after lifting-off the substrate is washed by hot water etc.

Figure 2H:
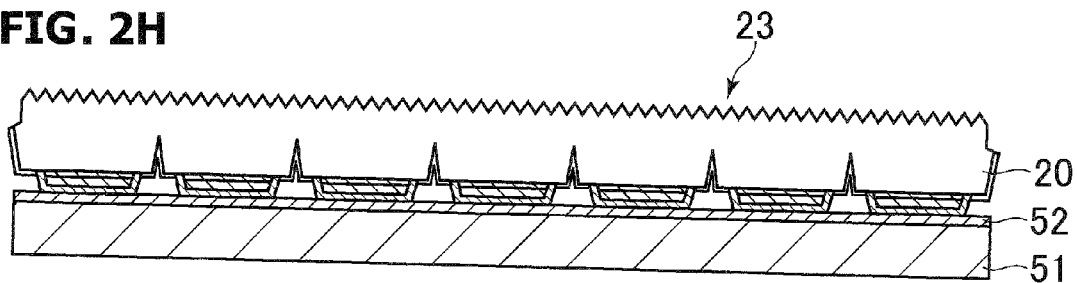
FIGS. 2A to 2N are cross sectional views illustrating processes for manufacturing a semiconductor light emitting element according to the embodiment, and FIG. 2AB is a schematic cross sectional view illustrating multiple quantum well structure.

As illustrated in FIG. 2H, the surface of the n-type GaN layer 24 of the semiconductor lamination 20 is dipped in alkaline solution of 50° C. to 100° C., to form recessed portions 23 which are called micro-cones. The sizes of the micro-cones increase with the time of dipping. The treating time is of the order of 1 minute to 15 minutes.

Figure 2I:
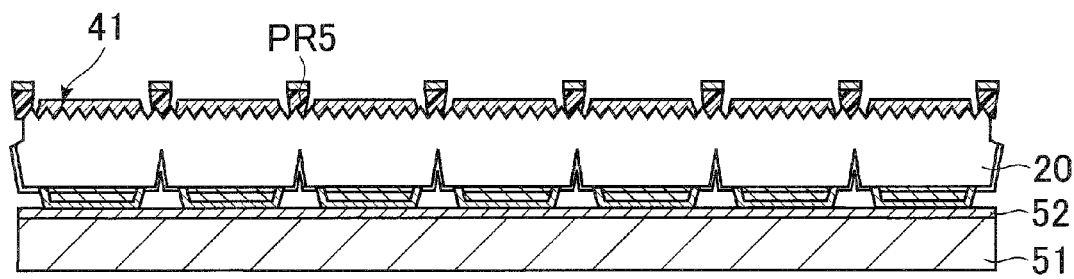

As illustrated in FIG. 2I, a photoresist pattern PR5 for patterning the n-side electrode is formed on the n-type GaN layer 24. Transparent electrode 41 such as ITO (indium tin oxide) is formed on the n-type GaN layer 24 of the semiconductor lamination 20, via the photoresist pattern PR5. The photoresist pattern PR5 is removed together with the transparent electrode deposited thereon by lift-off. The transparent electrode 41 is annealed by RTA (rapid thermal annealing) etc.

Figure 2J:
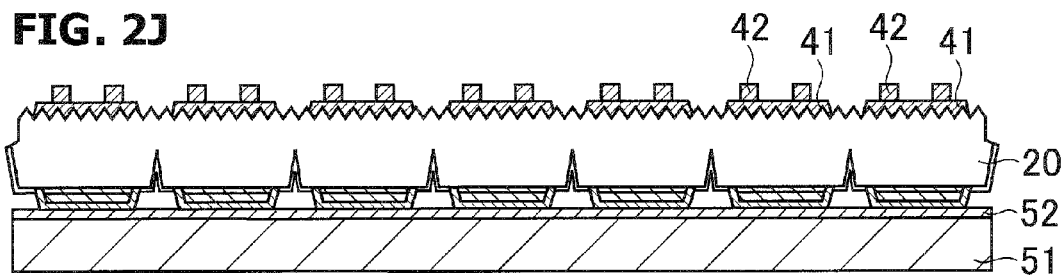

As illustrated in FIG. 2J, by similar lift-off method, the n-side electrode 42 of Ti/Al etc. is formed, for example in annular shape.

Figure 2K:
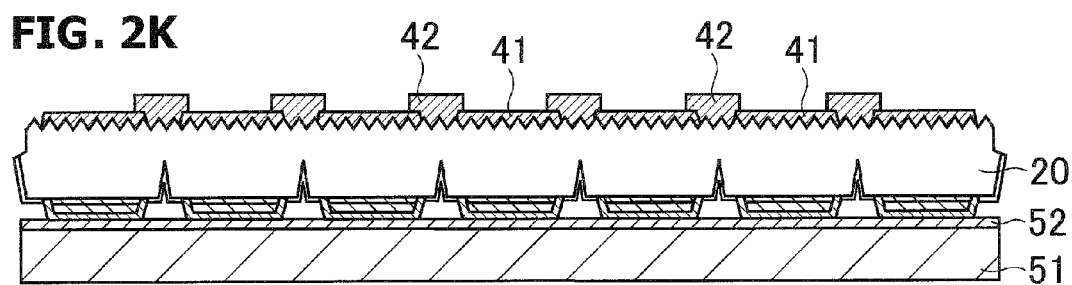

As illustrated in FIG. 2K, the transparent electrode 41 may be patterned to have aperture such that at least part of the n-side electrode 42 directly forms Ohmic contact with the n-type GaN layer 24. The n-side electrode 42 contacts the n-type GaN layer at least in part of the aperture.

Figure 2L:
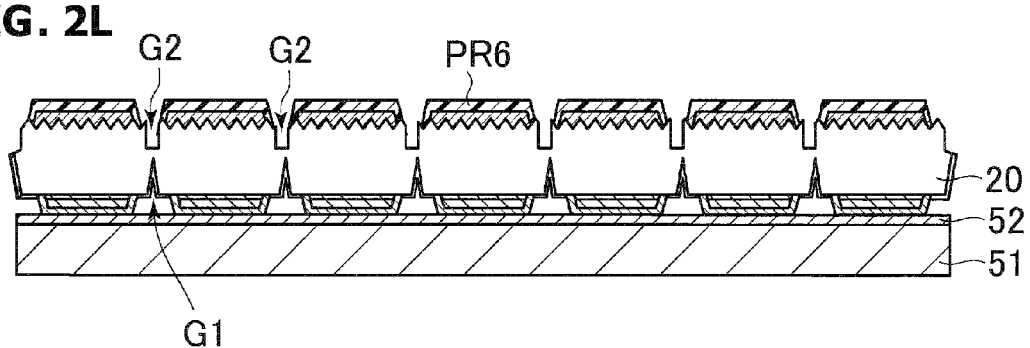

As illustrated in FIG. 2L, a photoresist pattern PR6 having apertures at locations corresponding to the first isolation grooves G1 is formed. The n-type GaN layer 24 of the semiconductor lamination 20 is etched by RIE using $Cl_2$ gas, using this photoresist pattern PR6 as a mask, to form second isolation grooves G2 having a depth of the order of 1 μm to 5 μm. Thickness of the order of 2 μm to 4 μm is left between the first isolation grooves and the second isolation grooves. The width of the second isolation groove G2 becomes narrower with increase in the depth. The slanted side surfaces of the groove have shape of outwardly expanding as it goes upward, and the slanted surface of the groove forms an obtuse bulk angle with the front surface of the semiconductor lamination (c.f. FIG. 1A). The photoresist pattern PR6 is removed thereafter.

Figure 2M:
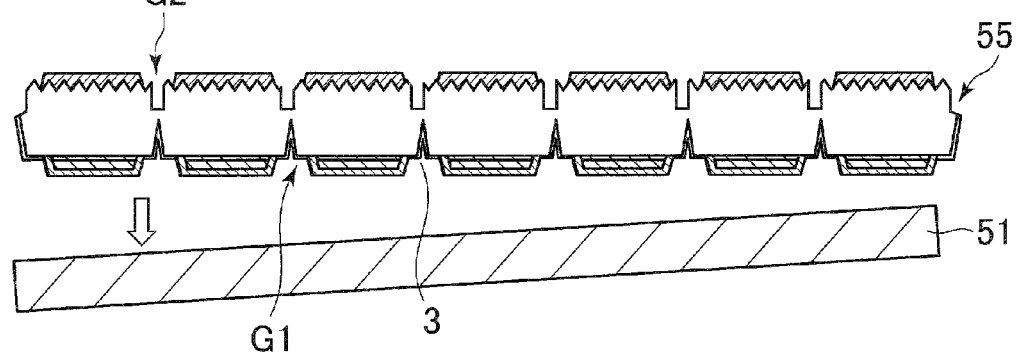

As illustrated in FIG. 2M, the bonded support substrate 51 is lifted off, to obtain the epitaxial wafer 55. Lifting-off may be done by etching or melting. When the fusion layer 52 is formed of In, it can be etched by hydrochloric acid etc. It is also possible to heat In till melting, to do lifting-off.

Figure 2N:
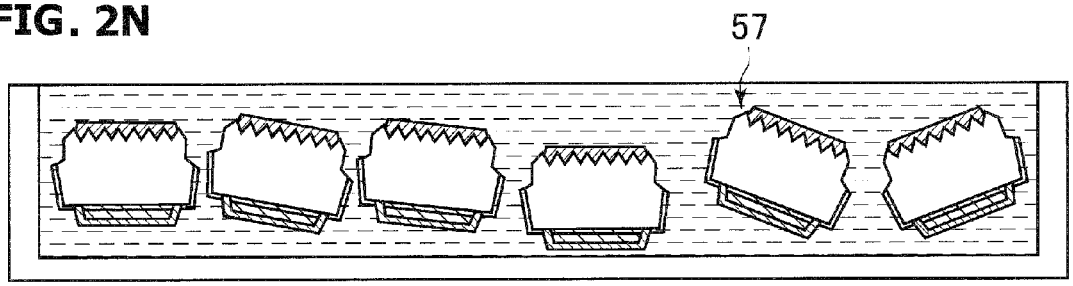

As illustrated in FIG. 2N, the epitaxial wafer 55 is dipped in solvent such as IPA (iso-propyl-alcohol), and is applied with ultrasonic waves, to decompose the epitaxial wafer by cavitation along the isolation grooves G1 and G2. Minute LED structures 57 are obtained. Light emitting diode chips having minute sizes are provided in this way. The solvent is not limited to IPA, and may be formed of any material provided that there is no bad influence.

Formation of the second isolation grooves G2 may not be done after the patterning of the transparent electrode, but may be done prior to formation of micro-cones in FIG. 2H. In this case, the second isolation grooves G2 will also be exposed to alkaline solution used for forming micro-cones. Therefore, micro-cones will also be formed on side surfaces 4 in FIG. 1A formed of second isolation grooves G2. Formation of micro-cones at the second isolation grooves G2 occurs, in the state of disposing the epitaxial layers horizontally, when the angle θ (c.f. FIG. 1A) of the slanted surface of the isolation groove is larger than 60 degrees and smaller than 75 degrees. Formation of micro-cones serves preferably for light derivation even at side surface 4. However, considering collision between elements in the solvent, angled portions of the micro-cones becomes easily broken. The slanted surface of the second isolation groove may be positively set at 60 degrees or less, or at 75 degrees or more, to avoid formation of micro-cones at side surfaces 4 while forming micro-cones at the surface of the n-type GaN layer 24.

Description has been made hereinabove on the various modes of carrying out the invention. This invention is not limited thereto. It will be apparent to those skilled in the art that various alterations, improvements, combinations, etc. are possible.

What are claimed are:

1. A method for manufacturing semiconductor optical elements comprising:
    epitaxially growing, on a growth substrate, a semiconductor lamination including a first semiconductor layer of a first conductivity type having a first surface, a second semiconductor layer of a second conductivity type opposite to the first conductivity type having a second surface, and an active layer sandwiched between the first semiconductor layer and the second semiconductor layer, the semiconductor lamination including in-plane element areas for forming a plurality of semiconductor elements;
    forming second conductivity type side electrodes on the second surface in the respective element areas;
    forming first isolation grooves from the second surface, penetrating through the second semiconductor layer and the active layer, and entering the first semiconductor layer, the first isolation grooves defining the in-plane element areas;
    bonding a support body on the second conductivity type side electrodes;
    removing the growth substrate and exposing the first semiconductor surface;
    forming first conductivity type side electrodes on the exposed first surface in the element areas;
    separating the semiconductor lamination from the support body; and
    applying external force and dividing the semiconductor lamination into a plurality of element areas.

2. The method for manufacturing semiconductor optical elements as recited in claim 1, further comprising:
    forming second isolation grooves from the first surface, entering the first semiconductor layer, at locations opposing the first isolation grooves, while leaving a gap from the first isolation grooves.

3. The method for manufacturing semiconductor optical elements as recited in claim 1, wherein the semiconductor lamination is formed of nitride semiconductors represented by $Al_xIn_yGa_{1-x-y}N$ ($0 \leq x \leq 1$, $0 \leq y \leq 1$).

4. The method for manufacturing semiconductor optical elements as recited in claim 1, further comprising:
    forming micro-cone structure in the first surface of the first semiconductor layer.

5. The method for manufacturing semiconductor optical elements as recited in claim 1, further comprising:
    forming a transparent electrode having an aperture on the first semiconductor layer, and forming a metal electrode which makes Ohmic contact with the first semiconductor layer in at least part of the aperture, and partially overlaps on the transparent electrode.

6. The method for manufacturing semiconductor optical elements as recited in claim 1, wherein the external force is given by applying ultrasonic waves or a pinch-roller.

7. The method for manufacturing semiconductor elements as recited in claim 6, further comprising dipping the semiconductor lamination in solvent before applying the external force, wherein the external force is given by applying ultrasonic waves.

8. The method for manufacturing semiconductor elements as recited in claim 1, wherein a width of the first isolation grooves decreases with depth.

9. The method for manufacturing semiconductor elements as recited in claim 2, wherein a width of the second isolation grooves decreases with depth.

10. The method for manufacturing semiconductor elements as recited in claim 1, wherein after applying external force and dividing the semiconductor lamination into a plurality of element areas, a side surface of each of the element areas has a cracked surface contiguous to the first isolation groove.

11. The method for manufacturing semiconductor elements as recited in claim 2, wherein after applying external force and dividing the semiconductor lamination into a plurality of element areas, a side surface of each of the element areas has a cracked surface contiguous to the first and second isolation grooves.

\* \* \* \* \*